United States Patent
Kim et al.

(10) Patent No.: US 9,123,289 B2
(45) Date of Patent: Sep. 1, 2015

(54) ORGANIC LIGHT EMITTING DIODE DISPLAY DEVICE WITH REFERENCE VOLTAGE LINES AND METHOD OF OPERATION IN AN ORGANIC LIGHT EMITTING DIODE DISPLAY DEVICE

(71) Applicant: LG Display Co., Ltd., Seoul (KR)

(72) Inventors: Yeong Moon Kim, Anseong-si (KR); Young Hak Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/313,500

(22) Filed: Jun. 24, 2014

(65) Prior Publication Data

US 2015/0001504 A1 Jan. 1, 2015

(30) Foreign Application Priority Data

Jun. 26, 2013 (KR) .......................... 10-2013-0073628
Jun. 19, 2014 (KR) .......................... 10-2014-0074825

(51) Int. Cl.
*H01L 27/32* (2006.01)
*G09G 3/32* (2006.01)

(52) U.S. Cl.
CPC .............. *G09G 3/3208* (2013.01); *H01L 27/32* (2013.01); *H01L 27/3276* (2013.01)

(58) Field of Classification Search
CPC ................................. H01L 27/28; H01L 27/32
USPC ........................................ 257/40; 345/76, 84
See application file for complete search history.

(56) References Cited

U.S. PATENT DOCUMENTS

2007/0195020 A1* 8/2007 Nathan et al. ................... 345/76

* cited by examiner

*Primary Examiner* — Selim Ahmed
(74) *Attorney, Agent, or Firm* — Fenwick & West LLP

(57) ABSTRACT

An OLED display device that includes multiple reference voltage lines. One reference voltage line provides a reference voltage to red, green and blue sub-pixels. Another reference voltage line provides a different reference voltage to white sub-pixels. The reference voltages can be controlled independently of each other to control brightness of the display device.

20 Claims, 10 Drawing Sheets

ORGANIC LIGHT EMITTING DIODE DISPLAY DEVICE WITH REFERENCE VOLTAGE LINES AND METHOD OF OPERATION IN AN ORGANIC LIGHT EMITTING DIODE DISPLAY DEVICE

CROSS REFERENCE TO RELATED APPLICATIONS

The present application claims priority under 35 U.S.C. §119(a) to Korean Patent Application No. 10-2013-0073628 filed on Jun. 26, 2013, and Korean Patent Application No. 10-2014-0074825 filed on Jun. 19, 2014, both of which are hereby incorporated by reference in their entirety.

BACKGROUND

1. Field of the Disclosure

The present application relates to an organic light emitting diode display device.

2. Description of the Related Art

As the information society spreads, the requirements for display devices are varied and gradually increasing. In accordance therewith, a variety of flat panel display devices with features such as slimness, light weight, low power consumption and so on are being researched. The flat panel display devices include liquid crystal display (LCD) devices, plasma display panels (PDP), organic light emitting diode (OLED) display device and so on, have been researched.

The OLED display device corresponds to a self-luminous display device which emits red, green and blue lights using organic compounds formed on a transparent substrate. In general, the OLED display device includes an OLED panel and a driving circuit. As such, the OLED display device does not require a separated light source, unlike the LCD device. In accordance therewith, the OLED display device can provide a simpler fabrication procedure and a lower fabrication cost, compared to the LCD device. In view of this point, the OLED display device is being spotlighted as a next generation flat panel display device. Also, the OLED display device provides a wider viewing angle and a higher contrast ratio, compared to the LCD device. Moreover, the OLED display device can be driven by a low direct-current voltage and endure well an external impact. Furthermore, the OLED display device has a short response time and a wide workable temperature range.

More specifically, the OLED display device of an active matrix type allows a voltage, which is applied to a pixel region and is used to control a current, to be charged into a storage capacitor and maintained until a next frame signal is applied. As such, the active matrix type OLED display device can maintain an emission state during an image display period regardless of the number of gate lines. In accordance therewith, the active matrix type OLED display device can provide sufficient brightness using little current. Therefore, the active matrix type OLED device can realize low power consumption and a large size.

Red, green, blue and white sub-pixels of an OLED display device according to the related art each include an OLED display element and a driving transistor. The driving transistor is used to adjust a current flowing through the OLED display element.

A current flowing through the driving transistor can be adjusted by a potential difference between gate and source electrodes of the driving transistor. The current flowing through the driving transistor is applied to the OLED display element. As such, the OLED display element can emit light. In other words, the quantity of light emitted from the OLED display element can be controlled by adjusting a voltage which is applied to the driving transistor. However, it is difficult for the related art OLED display device to obtain optimized brightness due to a threshold voltage deviation between the driving transistors.

BRIEF SUMMARY

Accordingly, embodiments of the present application are directed to an OLED display device that substantially obviates one or more of problems due to the limitations and disadvantages of the related art.

The embodiments relate to provide an OLED display device which is adapted to realize optimum brightness by providing reference voltage lines opposite to pixels.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

In one embodiment, an organic light emitting display device comprises a plurality of first sub-pixels, the plurality of first sub-pixels having first light emitting elements emitting first color light and first driving transistors to drive current through the first light emitting elements. A first reference voltage line provides a first reference voltage to source electrodes of the first driving transistors. A plurality of second sub-pixels have second light emitting elements emitting second color light and second driving transistors to drive current through the second light emitting elements. A second reference voltage line provides a second reference voltage to source electrodes of the second driving transistors.

In one embodiment, a plurality of third sub-pixels have third light emitting elements emitting third color light and third driving transistors to drive current through the third light emitting elements. A plurality of fourth sub-pixels have fourth light emitting elements emitting fourth color light and third driving transistors to drive current through the fourth light emitting elements. The second reference voltage line further provides the second reference voltage to source electrodes of the third driving transistors and source electrodes of the fourth driving transistors. For example, the first light emitting elements can emit white light, the second light emitting elements emit red light, the third light emitting elements emit green light, and the fourth light emitting elements emit blue light.

In one embodiment the display device comprises a sensing unit to determine first threshold voltages of the first driving transistor; determine second threshold voltages of the second driving transistors; determine third threshold voltages of the third driving transistors; and determine fourth threshold voltages of the fourth driving transistors. A reference voltage unit generates the first reference voltage based on the first threshold voltages and generates the second reference voltage based on the second, third and fourth threshold voltages.

In one embodiment a method of operation in an organic light emitting display device is disclosed. The method comprises providing a first reference voltage to a plurality of first sub-pixels, the plurality of first sub-pixels having first light emitting elements emitting first color light and first driving transistors to drive current through the first light emitting elements, the first reference voltage provided to source electrodes of the first driving transistors; and providing a second reference voltage to a plurality of second sub-pixels, the plurality of second sub-pixels having second light emitting elements emitting second color light and second driving transistors to drive current through the second light emitting elements, the second reference voltage provided to source electrodes of the second driving transistors.

According to one general aspect of the embodiments, an OLED display device includes pluralities of red, green, blue and white sub-pixels which each include: a driving transistor; an organic light emitting diode display element configured to emit light by a current which is adjusted according to a potential difference between gate and source electrodes of the driving transistor; and a sensing transistor configured to sense a voltage on the source electrode of the driving transistor and apply one of first and second reference voltages to the source electrode of the driving transistor. The first reference voltage depends on a threshold voltage of the driving transistor within each of the red, green and blue sub-pixel and is applied to the source electrode of the driving transistor included in each of the red, green and blue sub-pixels. The second reference voltage depends on another threshold voltage of the driving transistor within the white sub-pixel and is applied to the source electrode of the driving transistor within the white sub-pixel.

The OLED display device according to one general aspect of the present embodiments allows: each of the sub-pixels to further include a scan transistor which is controlled by a scan signal on a scan line and transfers a data voltage on a data line to the gate electrode of the driving transistor; the data voltage to be applied to the gate electrode of the driving transistor and an initial voltage to be applied to the source electrode of the driving transistor, in an initial interval; a voltage on the source electrode of the driving transistor to be varied during a sensing interval; the threshold voltage to detected by sensing the voltage on the source electrode of the driving transistor during a sampling interval; and one of the first and second reference voltages to be applied to the source electrode of the driving transistor during an emitting interval.

In the OLED display device according to one general aspect of the present embodiments, the sensing transistors of the red, green and blue sub-pixels are connected to a first sub reference voltage line, and the sensing transistor of the white sub-pixel is connected to a second sub reference voltage line.

The OLED display device according to one general aspect of the present embodiments allows the sensing transistor to apply a voltage on the sub reference voltage line to the source electrode of the driving transistor in response to a sensing control signal.

The OLED display device according to one general aspect of the present embodiments allows not only the initial voltage to be applied from the sub reference voltage line to the source electrode of the driving transistor during the initial interval but also the source electrode of the driving transistor to be floated during the sensing interval.

The OLED display device according to one general aspect of the present embodiments further includes a sensing unit configured to sense the voltages on the source electrodes of the driving transistors and detect the threshold voltages of the driving transistors on the basis of the sensed voltages.

The OLED display device according to one general aspect of the present embodiments further includes a reference voltage unit configured to set the first and second reference voltages on the basis of the detected threshold voltages from the sensing unit, a distributional curve of the threshold voltage of the driving transistor within each of the red, green and blue sub-pixel, and another curve of the threshold voltage of the driving transistor with the which sub-pixel.

The OLED display device according to one general aspect of the present embodiments further includes: a main reference voltage line formed to transfer the first and second reference voltages from the reference voltage unit to the first and second sub reference voltage lines; and a switching element configured to selectively connect the main reference voltage line with any one of the first and second sub reference voltage lines.

The OLED display device according to one general aspect of the present embodiments allows the switching element to include a first switching element configured to electrically connect the main reference voltage line and the first sub reference voltage line, and a second switching element configured to electrically connect the main reference voltage line and the second sub reference voltage line.

The OLED display device according to one general aspect of the present embodiments further includes a demultiplexer configured to selectively connect one of the first and second sub reference voltage lines to the reference voltage unit.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION OF THE EMBODIMENTS

Figure 1:
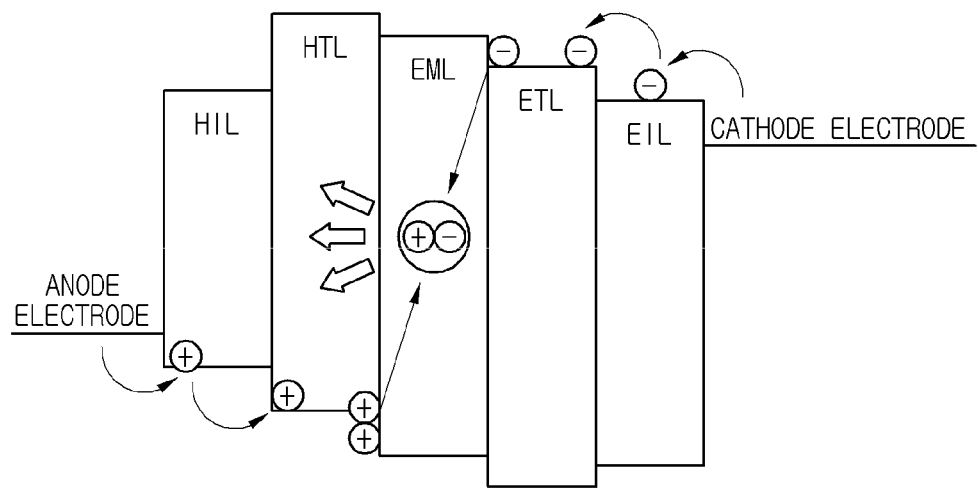
FIG. 1 is a schematic diagram showing an OLED display element.

Reference will now be made in detail to an OLED display device in accordance with the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

Reference will now be made in detail to an OLED display device in accordance with the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

The present disclosure relates to an OLED display device applying independent reference voltages to red, green, blue and white sub-pixels. Configuration and operation of such an OLED display device and detailed structure of an OLED display element will now be described.

FIG. 1 is a schematic diagram showing an OLED display element.

Referring to FIG. 1, the OLED display element generally includes an electron injection layer EIL, an electron transport layer ETL, an emission layer EML, a hole transport layer HTL and a hole injection layer HIL which are stacked between an anode electrode and an cathode electrode. If an arbitrary voltage is applied between the anode and cathode electrodes of such an organic light emitting diode, not only electrons are drifted from the cathode electrode to the emission layer EML via the electron injection layer EIL and the electron transport layer ETL, but also holes are drifted from the anode electrode to the emission layer EML via the hole injection layer HIL and the hole transport layer HTL. As such, the electrons applied from the electron transport layer ETL and the holes applied from the hole transport layer HTL are recombined with each other within the emission layer EML. In accordance therewith, light can be emitted from the emission layer EML.

Figure 2:
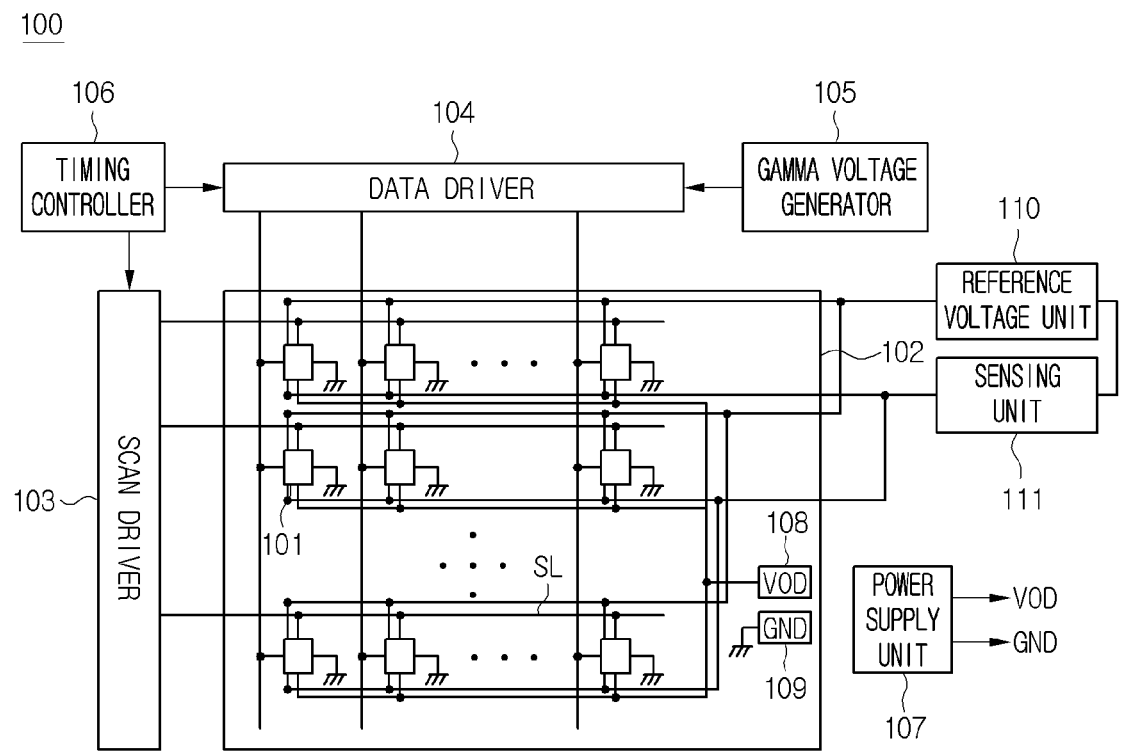
FIG. 2 is a circuit diagram showing an OLED display device.

FIG. 2 is a circuit diagram showing an OLED display device.

An OLED display device 100 using the above-mentioned OLED display element can include an OLED panel 102, a scan driver 103, a data driver 104, a gamma voltage generator 105, a timing controller 106, a power supply unit 107, a reference voltage unit 110 and a sensing unit 111. The OLED panel 102 can include a plurality of pixels 101, a power supply pad 108 and a ground pad 109.

In detail, as shown in FIG. 2, the OLED display device 100 can include an OLED panel with a plurality of pixels 101 arranged in respective pixel regions which are defined by crossing scan lines SL and data lines DL; a scan driver 103 configured to drive the scan lines SL on the OLED panel 102, and a data driver 104 configured to drive the data lines DL on the OLED panel 102. Also, the OLED display device 100 can include a gamma voltage generator 105 configured to apply a plurality of gamma voltages to the data driver 104, a timing controller 106 configured to control the scan driver 103 and the data driver 104, and a power supply unit 107 configured to apply power supply voltages to the pixels 101.

The pixels 101 can include sub-pixels emitting red, green, blue and white lights.

The pixels 101 on the OLED panel 102 can be arranged in a matrix shape. A power supply pad 108 and a ground pad 109 can be formed on the OLED panel 102. The power supply pad 108 is used to receive a high voltage VDD from the power supply unit 107. The ground pad 109 is used to receive a ground voltage GND from the power supply unit 107.

The high voltage VDD transferred to the power supply pad 108 can be applied to each of the pixels 101. The ground voltage GND transferred to the ground pad 109 can be also applied to each of the pixels 101.

The scan driver 103 can sequentially apply a scan pulse to the scan lines SL. As such, the scan lines SL can be sequentially driven.

The gamma voltage generator 105 can generate the gamma voltages with a variety of voltage levels. Such gamma voltages can be applied from the gamma voltage generator 105 to the data driver 104.

The data driver 104 converts digital data signals input from the timing controller 106 into analog data signals using the gamma voltages applied from the gamma voltage generator 105. Also, the data driver 104 applies the analog data signals to the data lines DL on the OLED panel 102 whenever the scan pulse is applied to one of the scan lines SL.

The timing controller 106 generates data control signals and scan control signals using synchronous signals which are applied from an external system such as a graphic card. The data control signals are used to control the data driver 104. The scan control signals are used to control the scan driver 103.

The data control signals generated in the timing controller 106 are applied to the data driver 104 in order to control the data driver 104. Similarly, the scan control signals generated in the timing controller 106 are applied to the scan driver 103 in order to control the scan driver 103. Also, the timing controller 106 transfers the digital data signals, which are applied from the external system, to the data driver 104.

Each of the pixels 101 receives the data signal from the respective data line DL when the scan pulse is applied to the respective scan line SL. Also, each of the pixels 101 emits an amount of light corresponding to the received data signal.

The reference voltage unit 110 can generate references which will be applied to the OLED panel 102. Also, the reference voltage unit 110 can apply the reference voltages to the respective pixels 101 on the OLED panel 102.

The sensing unit 111 can enable a compensation circuit such as the reference voltage unit 110 to compensate for a threshold voltage of a driving transistor which is included in each of the pixels 101. Also, the sensing unit 111 can allow the compensation circuit (for example, the reference voltage unit 110) to supply compensation signals (for example, adjusted reference voltages) to the OLED panel 102. In accordance therewith, high brightness can be realized.

In this manner, the sensing unit 111 can sense the threshold voltage Vth of the driving transistor within each of the pixels 101, and the reference voltage unit 110 can adjust the reference voltages based on the sensed data and output the adjusted reference voltages to the OLED panel 102. A distributional map of initial threshold voltages Vth for driving transistors on the OLED panel 102 can be used in the adjustment of the reference voltages. The threshold voltage Vth of the driving transistor can depend on a size of the driving transistor. Such a threshold voltage Vth of the driving transistor can be represented by the following equation 1.

$$V_{th} = \phi_{ms} - \left(\frac{Q_{ox}}{C_{ox}} + \frac{Q_d}{C_{ox}}\right) + 2\phi_f \quad \text{[Equation 1]}$$

In the equation 1, '$\phi ms$' is a contact potential difference (or a work-function difference) between a metal and a semiconductor, '$Qox$' is a fixed charge quantity on the surface of an oxide film, '$Qd$' is a positive charge quantity on an ionic layer, '$Cox$' is a capacitance per unit area of the gate electrode, and '$\phi f$' is a difference between an intrinsic level Ei and a Fermi level. The capacitance Cox per unit area of the gate electrode, which is included in the equation 1, can be defined by the following equation 2.

$$C_{ox} = \frac{\epsilon_o \epsilon_r}{t_{ox}} \quad \text{[Equation 2]}$$

In the equation 1, '$\epsilon o$' is permittivity of free space, '$\epsilon r$' is a relative dielectric constant, and 'tox' is the thickness of an oxide film.

As seen from the equations 1 and 2, it is evident that the threshold voltage Vth of the driving transistor can depend on a size of the gate electrode of the driving transistor and the dielectric constants.

In one example, the size of the driving transistor of the red sub-pixel is about 142 μm, the size of the driving transistor of the green sub-pixel is about 122 μm, the size of the driving transistor of the blue sub-pixel is about 145 μm, and the size of the driving transistor of the white sub-pixel is about 82 μm. In other words, the driving transistor of the white sub-pixel has a smaller size compared to those of the red, green and blue sub-pixels. This results from the fact that the white sub-pixel has a superior emission efficiency compared to the other sub-pixels and does not require any color filter unlike the other sub-pixels.

The small-sized driving transistor of the white sub-pixel results in the threshold voltage Vth of the driving transistor of the white sub-pixel being higher than those of the driving transistors of the red, green and blue sub-pixels.

Figure 3:
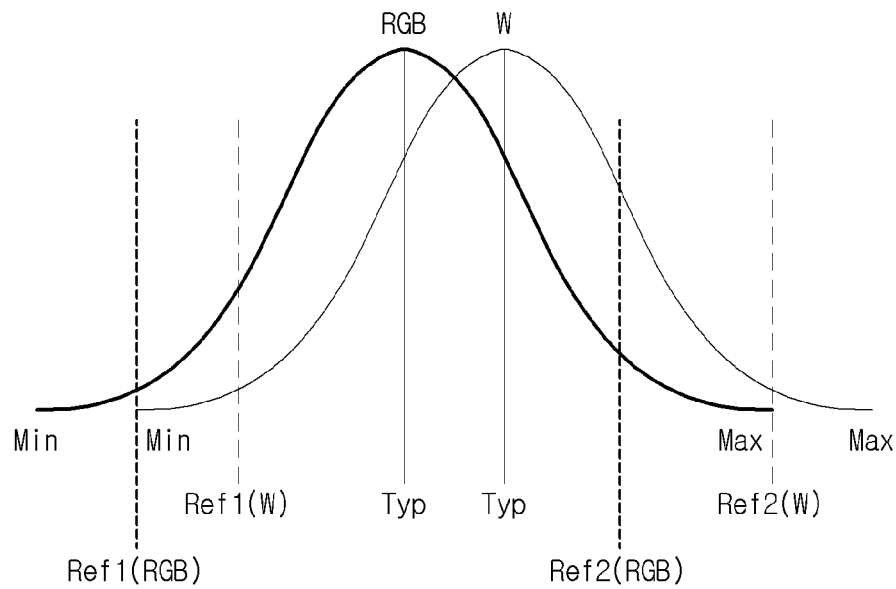
FIG. 3 is a graph illustrating a distributional map of threshold voltages of red, green, blue and white sub-pixels.

FIG. 3 is a graph illustrating a distributional map of threshold voltages of red, green, blue and white sub-pixels.

As shown in FIG. 3, threshold voltages of red, green and blue sub-pixels represented by a solid line and a threshold voltage of a white sub-pixel represented by dotted lines can be normalized in distributional curve shapes.

As seen from the distributional map of the threshold voltages of FIG. 3, it is evident that the threshold voltages of the red, green and blue sub-pixels are similar to one another but the threshold voltage of the white sub-pixel is higher than these of the red, green and blue sup-pixels.

In other words, the driving transistor of the white sub-pixel is smaller than those of the red, green and blue sub-pixels. As such, the threshold voltage of the driving transistor of the white sub-pixel is distributed higher than those of the driving transistors of the red, green and blue sub-pixels.

In view of these points, it is necessary to sense the threshold voltages of driving transistors within the red, green and blue sub-pixels and the threshold voltage of a driving transistor within the white sub-pixel and generate independent reference voltages, which are applied to the red, green and blue sub-pixels and the white sub-pixel, based on the sensed threshold voltages, in order to display high quality images.

Subsequently, an OLED display device 100 adapted to apply independent reference voltages to the red, green and blue sub-pixels and the white sub-pixel will be described.

Figure 4:
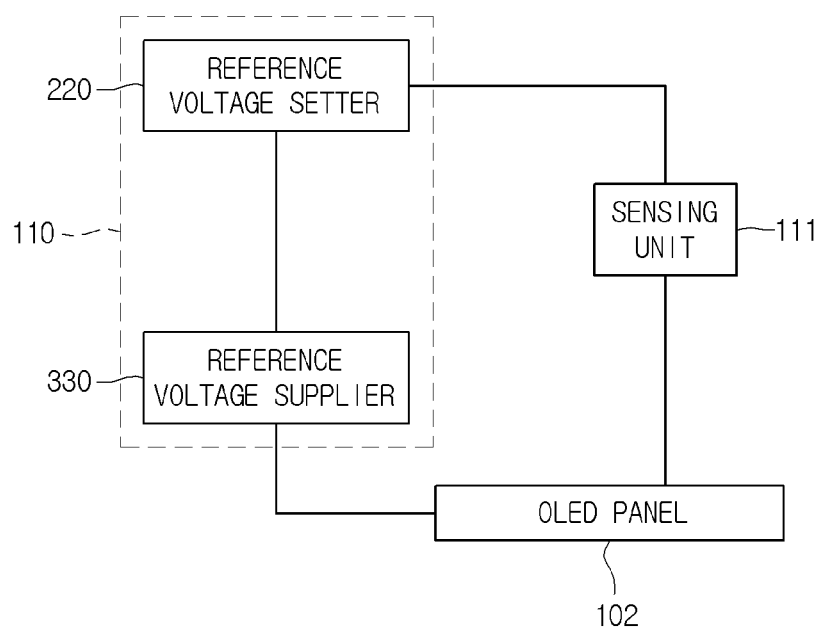
FIG. 4 is a block diagram showing a sensing configuration of the OLED display device according to an embodiment of the present disclosure.

FIG. 4 is a block diagram showing a sensing configuration of the OLED display device according to an embodiment of the present disclosure.

Referring to FIG. 4, the OLED display device according to an embodiment of the present disclosure can include a reference voltage unit 110, a sensing unit 111 and an OLED panel 102. The reference voltage unit 110 can include a reference voltage setter 220 and a reference voltage supplier 330.

The reference voltage setter 220 can set up a first reference voltage for driving transistors of the red, green and blue sub-pixels and a second reference voltage for a driving transistor of the white sub-pixel. To this end, the reference voltage setter 220 can use threshold voltages of the driving transistors of the sub-pixels which are obtained by sensing transistors on the OLED panel 102.

The first and second reference voltages being set up by the reference voltage setter 220 can be applied to the pixels through the reference voltage supplier 330 (i.e. reference voltage supply). In detail, the first reference voltage can be applied to the red, green and blue sub-pixels and the second reference voltage can be applied to the white sub-pixel. In this manner, the red, green and blue sub-pixels and the white sub-pixel are independently connected to two reference voltage lines. As such, the reference voltages for the red, green and blue sub-pixels and the white sub-pixel can be optimized by the first and second reference voltages which are transferred through first and second reference voltage lines. In accordance therewith, optimized brightness can be realized.

Figure 5:
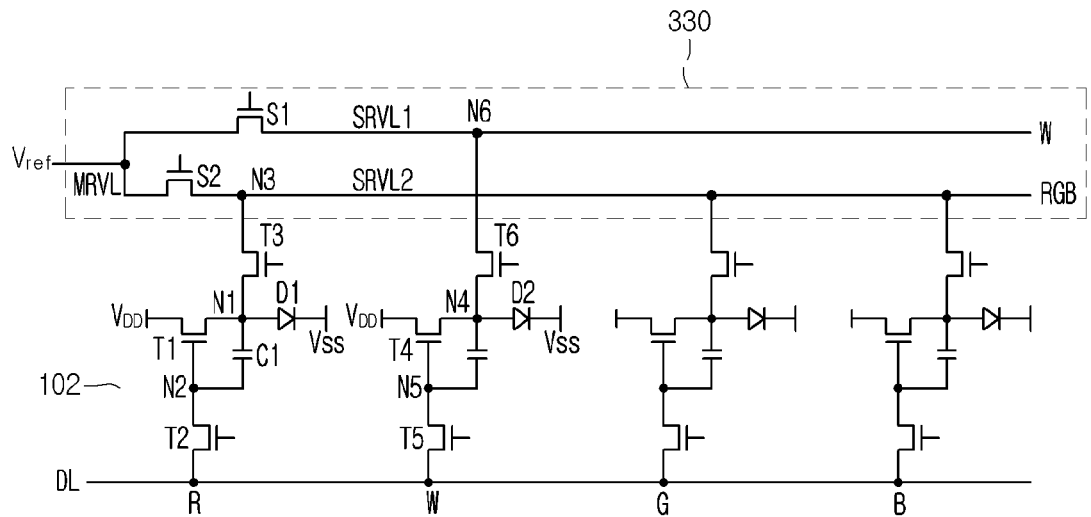
FIG. 5 is a detailed circuit diagram showing a reference voltage unit and sub-pixels of the OLED display device according to an embodiment of the present disclosure.

FIG. 5 is a detailed circuit diagram showing a reference voltage supplier and sub-pixels of the OLED display device according to an embodiment of the present disclosure.

The detailed configuration of a reference voltage supplier 330 and each pixel 101 of the OLED display device according to an embodiment of the present disclosure will now be described referring to FIG. 5.

Red, green, blue and white sub-pixels are formed on the OLED panel 102.

The red sub-pixel can include a first driving transistor T1, a first scan transistor T2 and a first sensing transistor T3, a first storage capacitor C1 and a first OLED display element D1 emitting red color light.

The first OLED display element D1 can be connected between a first node N1 and a low voltage source (or line) VSS. The first driving transistor T1 can be connected between a high voltage source (line) VDD, the first node N1 and a second node N2. A source of the driving transistor T1 is connected to node N1, and a gate of the driving transistor T1 is connected to node N2, and a drain of the driving transistor T1 is connected to VDD.

The first scan transistor T2 can be connected between the second node N2, a data line DL and a scan line SL.

The first storage capacitor C1 can be connected between the first node N1 and the second node N2.

The first sensing transistor T3 can be controlled by a sensing control signal of the sensing unit 111 (shown FIG. 5). To this end, the first sensing transistor T3 can be connected between the first node N1 and a third node N3 and have a gate electrode connected to the sensing unit 111.

The above-mentioned configuration of the red sub-pixel can be applied to the green and blue sub-pixels in the same way.

Also, the first scan transistor T2 can be turned-on by a scan pulse which is transferred through the scan line SL. The first driving transistor T1 can be controlled by a voltage on the second node N2. The first storage capacitor C1 can be charged with a voltage corresponding to a potential difference between the first node N1 and the second node N2.

Meanwhile, the white sub-pixel can include a second driving transistor T4, a second scan transistor T5, a second sensing transistor T6, a second storage capacitor C2 and a second OLED display element D2 emitting white color light.

The second OLED display element D2 can be connected between a fourth node N4 and the low voltage source (or line) VSS. The second driving transistor T4 can be connected between the high voltage source (line) VDD, the fourth node N4 and a fifth node N5. A source of the driving transistor T4 is connected to node N4, and a gate of the driving transistor T4 is connected to node N5, and a drain of the driving transistor T4 is connected to VDD.

The second scan transistor T5 can be connected between the fifth node N5, the data line DL and the scan line SL.

The second storage capacitor C2 can be connected between the fourth node N4 and the fifth node N2.

The second sensing transistor T6 can be controlled by the sensing control signal of the sensing unit 111 (shown FIG. 5). To this end, the second sensing transistor T6 can be connected between the fourth node N4 and a sixth node N6 and have a gate electrode connected to the sensing unit 111.

Also, the second scan transistor T5 can be turned-on by the scan pulse which is transferred through the scan line SL. The second driving transistor T4 can be controlled by a voltage on the fifth node N5. The second storage capacitor C2 can be charged with a voltage corresponding to a potential difference between the fourth node N4 and the fifth node N5.

The reference voltage supplier 330 can include a main reference voltage line MRVL and first and second sub reference voltage lines SRVL1 and SRVL2. The main reference voltage line MRVL carries reference voltages to the first and second sub reference voltage lines SRVL1 and SRVL2 at different times. Also, the reference voltage supplier 330 can include a first switching element S1 connected between the main reference voltage line MRVL and the first sub reference voltage line SRVL1, and a second switching element S2 connected between the main reference voltage line MRVL and the second sub reference voltage line SRVL2.

The first switching element S1 is connected between the main reference voltage line MRVL and the sixth node N6. As such, the first switching element S1 can selectively connect or disconnect the main reference voltage line MRVL to or from the sixth node N6 through a switching operation. The second switching element S2 is connected between the main reference voltage line MRVL and the third node N3. As such, the second switching element S2 can selectively connect or disconnect the main reference voltage line MRVL to or from the third node N3 through a switching operation.

Although it is explained that the reference voltage supplier 330 has the above-mentioned circuit configuration, the first and second switching elements S1 and S2 can be replaced by a multiplexing circuit (e.g., a demultiplexer, multiplexer, bi-directional multiplexer). In the case where the multiplexing circuit is a demultiplexer, the main reference voltage line MRVL is connected to an input terminal of the demultiplexer, and the first and second sub reference voltage lines SRVL1 and SRVL2 are connected to first and second output terminals of the demultiplexer.

In this manner, independent reference voltages can be applied to the red, green and blue sub-pixels and the white sub-pixel, using the single main reference voltage line MRVL, the first and second sub reference voltage lines SRVL1 and SRVL2 connectable to the main reference voltage line MRVL and the first and second switching elements S1 and S2 controlling the electrical connection of the first and second sub reference voltage lines SRVL1 and SRVL2 with the main reference voltage line MRVL. In other words, the independent supply of the different reference voltages for the red, green and blue sub-pixels and the white sub-pixel can be realized using the sub reference voltage lines SRVL1 and SRVL2 and the first and second switching elements S1 and S2 without an additional main reference voltage line and a separate driver chip.

The OLED display device of the present disclosure can optimize reference voltages for each sub-pixel by setting up different reference voltages to the red, green, blue and white sub-pixels, unlike a mode of allowing the red, green, blue and white sub-pixels to share a single reference voltage with one another. Actually, a distributional map of initial threshold voltages of the driving transistors can be used to determine reference voltages for the sub-pixels. However, the initial threshold voltages of the driving transistors can be difference from one another according the sub-pixels. As such, independent reference lines can be applied to the sub-pixels and different reference voltages can be set up for the sub-pixels. In accordance therewith, optimized brightness can be realized.

In order to apply different reference voltages to the sub-pixels, the number of reference voltage lines must increase and the size of a driver chip must be enlarged. To address this matter, the demultiplexer disclosed in an embodiment of the present disclosure can be used in the OLED display device. The demultiplexer allows different reference voltages to be applied to the sub-pixels without enlarging the size of the driver chip. In accordance therewith, optimized brightness can be realized.

A threshold voltage compensation procedure of the present disclosure will now be described in detail in reference to circuitry and waveform diagrams.

Figure 6:
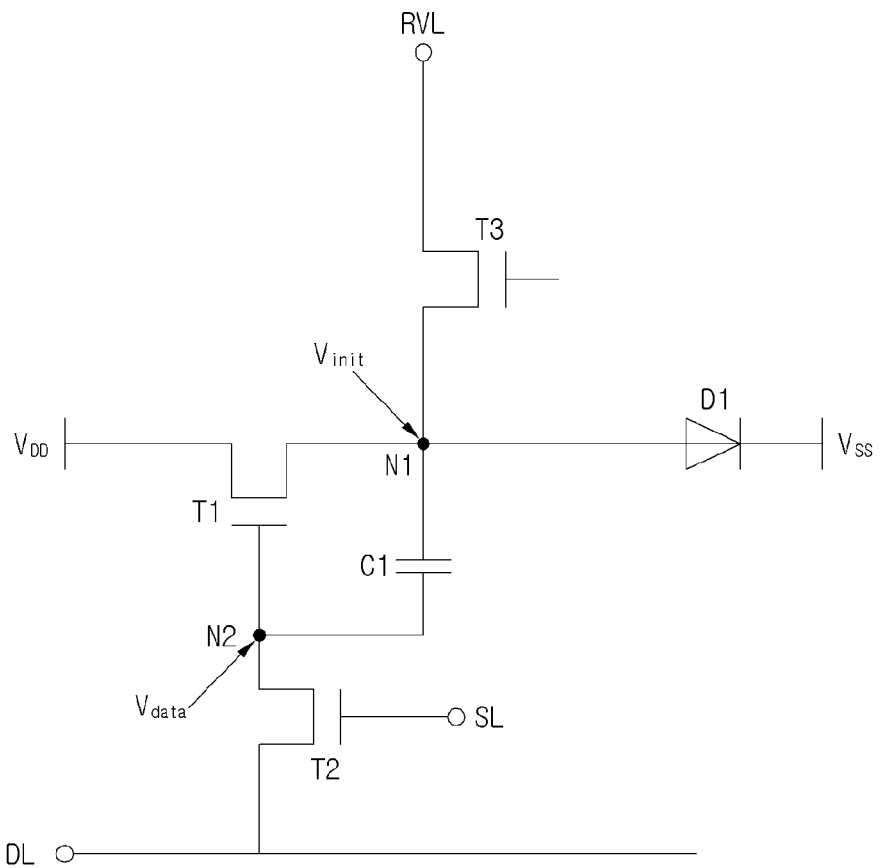
FIGS. 6 through 8 are circuit diagrams illustrating an operation of one of red, green, blue and white sub-pixels according to an embodiment of the present disclosure.
Figure 7:
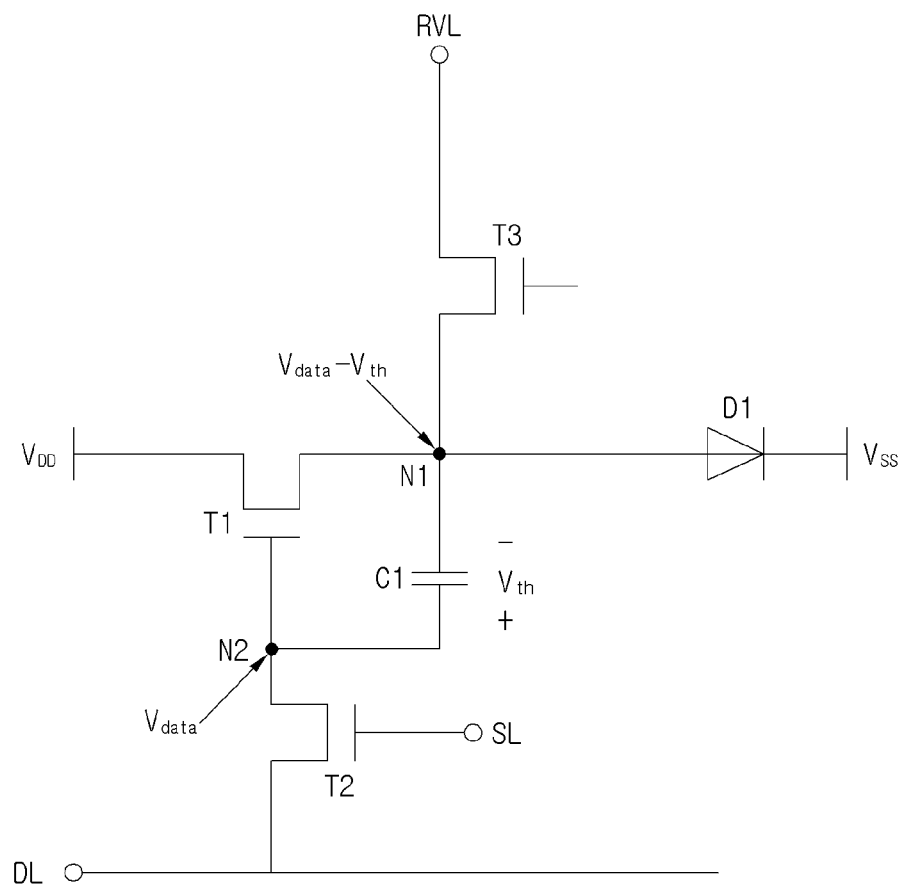
Figure 8:
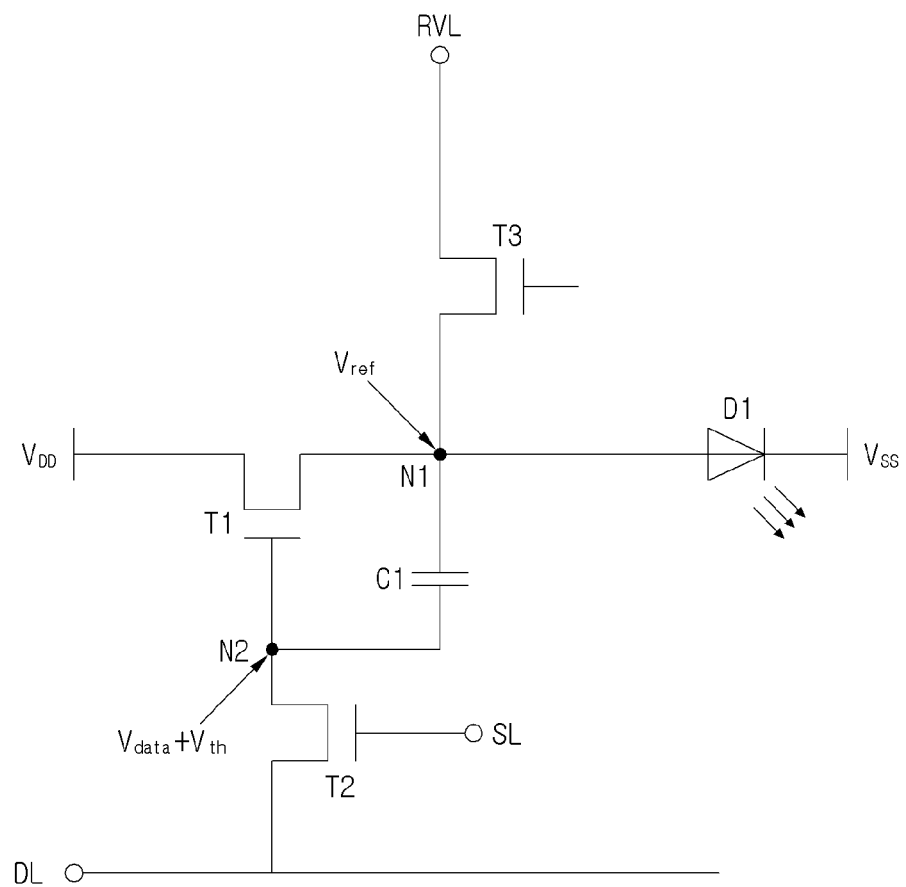
Figure 9:
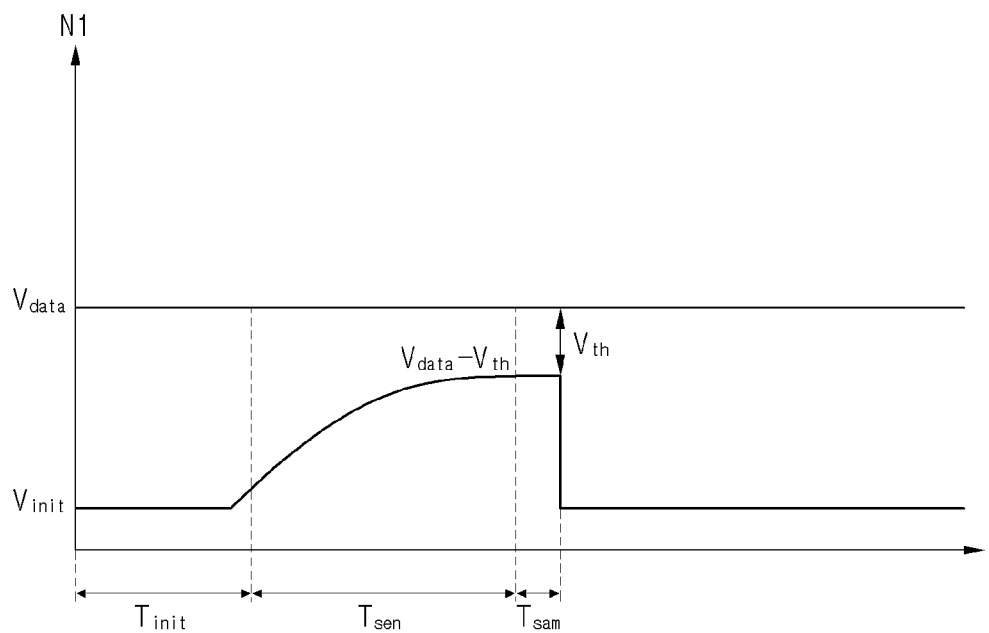
FIG. 9 is a waveform diagram illustrating a threshold voltage compensation procedure.

FIGS. 6 through 8 are circuit diagrams illustrating an operation of one of red, green, blue and white sub-pixels according to an embodiment of the present disclosure. FIG. 9 is a waveform diagram illustrating a threshold voltage compensation procedure.

Referring to FIGS. 6 through 9, the threshold voltage compensation procedure can be defined into an initial interval Tinit, a sensing interval Tsen and a sampling interval Tsam.

For convenience of explanation, the red sub-pixel among the red, green, blue and white sub-pixels will now be representatively described, but the description of the red sub-pixel can be applied to the other color sub-pixels.

<Initial Interval Tinit>

Referring to FIGS. 6 and 9, in the initial interval Tinit, the scan transistor T2 is turned-on by the scan pulse of a high level on the scan line SL and the sensing transistor T3 is turned-on by a sensing control signal applied from the sensing unit 111.

The turned-on scan transistor T2 enables a data voltage Vdata transferred through the data line DL to be charged into the second node N2. Also, the turned-on sensing transistor T3 allows an initial voltage Vinit transferred through a reference voltage line RVL (i.e., SRVL) to be charged into the first node N1. The data voltage Vdata transferred through the reference voltage line RVL can become a previously set virtual data voltage, which is used to compensate for the threshold voltage, not a real data voltage which is used to control light emission amount of the OLED display element D1. Also, the initial voltage Vinit can be set to be lower than the low voltage Vss. In other words, the low voltage Vss can be set to be higher than the initial voltage Vinit in order present the emission of the OLED display element D1.

In this time, a voltage between the gate and source electrodes of the driving transistor T1 becomes larger than the threshold voltage Vth of the driving transistor T1. As such, the driving transistor T1 is turned-on and driven as a source follower. In accordance therewith, a current flowing through the driving transistor T1 can become a proper initial value.

The storage capacitor C1 connected between the gate and source electrodes of the driving transistor T1 (which is driven as a source follower) and enables a source voltage of the driving transistor T1 to follow a gate voltage of the driving transistor T1 so that the threshold voltage Vth of the driving transistor T1 can be detected. Moreover, the high voltage VDD is applied from the high voltage source (or line) VDD to the drain electrode of the driving transistor T1 which is disconnected from the gate electrode of the driving transistor T1. As such, the driving transistor T1 driven in a source follower mode can allow not only a positive threshold voltage but also a negative threshold voltage to be detected.

<Sensing Interval Tsen>

FIGS. 7 and 9 illustrate pixel operation during a sensing interval Tsen. During the sensing interval Tsen the scan transistor T2 is still on and the sense transistor T3 is still on. However, the initial voltage Vinit is no longer applied to the first node N1 through the reference voltage line RVL and the sensing transistor T3. As such, the first node N1 becomes a floating state. This will later be explained in greater detail by reference to FIGS. 11 and 12. In accordance therewith, a voltage at the first node N1 rises due to current flowing through the driving transistor T1.

The voltage of the first node N1 rises to a voltage of 'Vdata−Vth'. This causes the voltage difference between the second node N2 and the first node N1 to reach the threshold voltage Vth of the driving transistor T1, which in turn causes the current flowing through the driving transistor T1 to become "0". As such, the voltage of the first node N1 maintains a constant voltage of "Vdata−Vth".

<Sampling Interval Tsam>

FIGS. 7 and 9 also illustrate pixel operation during a sampling interval Tsam. During the sensing interval Tsen, the scan transistor T2 is still on and the sense transistor T3 is still on. The source voltage of 'Vdata−Vth' is sensed from the first node N1 at the source electrode of transistor T1 during the sampling interval Tsam through the reference voltage line RVL. In accordance therewith, the threshold voltage Vth of the driving transistor T1 can be detected using a voltage difference between the source voltage sensed from the first node N1 and the data voltage Vdata applied to the second node N2.

<Emitting Interval>

FIG. 8 illustrates pixel operation during an emitting interval that follows the sampling interval Tsam. The scan transistor T2 can be turned-on and the sensing transistor T3 can be turned-on, in the emitting interval.

The turned-on scan transistor T2 applies a compensated data voltage of 'Vdata+Vth' transferred through the data line DL to the second node N2. Also, the turned-on sensing transistor T3 applies a reference voltage Vref transferred through the reference voltage line RVL to the first node N1.

A current flows through the driving transistor T1 by a voltage difference between the voltages of the first and second nodes N1 and N2. The current flowing through the driving transistor T1 is applied to the OLED display element D1. In accordance therewith, the OLED display element D1 can emit light. The current Ioled of the OLED display element D1 can be defined as the following equation 3.

$$I_{oled} = \frac{\beta}{2}(V_{gs} - V_{th})^2 \quad \text{[Equation 3]}$$

-continued $$V_g = V_{data}$$

$$V_s = V_{init}$$

$$I_{oled} = \frac{\beta}{2}(V_{gs} - V_{th})^2 = \frac{\beta}{2}(V_{data} - V_{init} - V_{th})^2$$

Wherein, 'Vgs' is a different voltage between a gate voltage Vg and a source voltage Vs of the driving transistor T1, 'Vinit' is an initial voltage, 'Ioled' is a driving current of the OLED display element D1. Also, 'Vth' is a threshold voltage of the driving transistor T1 and 'β' is a constant value which is determined by mobility and parasitic capacitance of the driving transistor T1.

As seen from the above-mentioned equations, it is evident that the driving current Ioled of the OLED display element D1 is greatly affected by the threshold voltage Vth of the driving transistor T1.

In this way, a voltage applied to the second node N2 is set to be the voltage of 'Vdata+Vth' through the compensation of the threshold voltage Vth of the driving transistor T1. In this case, the driving current Ioled of the OLED display element D1 can be represented as the following equation 4.

$$I_{oled} = \frac{\beta}{2}(V_{data} + V_{th} - V_{ref} - V_{th})^2 = \frac{\beta}{2}(V_{data} - V_{ref})^2 \quad \text{[Equation 4]}$$

In other words, because the compensated data voltage of 'Vdata+Vth' which is compensated by the threshold voltage Vth of the driving transistor T1 is applied to the second node N2, the driving current of the OLED display element D1 can depend on the data voltage Vdata and the reference voltage Vref regardless of the threshold voltage Vth of the driving transistor D1.

<Reference Voltage Setting Process>

As shown in FIG. 9, the sub-pixels have different distribution trends from one another with respect to the threshold voltages. A distributional curve of the threshold voltage of the white sub-pixel is shifted from another distributional curve of the threshold voltage of the red, green and blue sub-pixels toward the right.

It is illustrated in the drawing that the distributional difference of the threshold voltages is between the white sub-pixel and the red, green and blue sub-pixels. In other embodiments, there may a different distribution of threshold voltages for each of the red, green, blue and white sub-pixels, resulting in four different threshold voltage distributions. In order to compensate for differences between the threshold voltages of the red, green, blue and white sub-pixels, wiring must be increased and a driver IC (Integrated circuit) must be complicated and enlarged. However, as seen from the distributional map of the threshold voltages of the sub-pixels, it is evident that the white sub-pixel is remarkably different compared to the threshold voltages of the red, green and blue sub-pixel. As such, it is preferable to divide the sub-pixels into the white sub-pixel and red, green and blue sub-pixels and to set different reference voltages for the different sub-pixel groups.

A method of setting the reference voltages will now be described.

If the threshold voltages of the sub-pixels detected in the sampling interval Tsam are collected and analyzed for the compensation of the threshold voltages, the threshold voltages are mostly distributed between a minimum value Min and a maximum value Max on around an average value Typ, as shown in FIG. 3. In other words, when the threshold voltages of the driving transistors of the sub-pixels are measured, collected and analyzed, the reference voltages can be set to suitable values.

For example, two reference values Ref1 and Ref2 can be set with respect to each of the distributional curves of the threshold voltages of the driving transistors. In detail, two reference values Ref1(RGB) and Ref2(RGB) can be set for the driving transistors of the red, green and blue sub-pixels, and two reference values Ref1(W) and Ref2(W) can be set for the driving transistor of the white sub-pixel. Also, the two reference values Ref1 and Ref1 can be selectively employed according to whether the driving transistor is one of an N-channel type and a P-channel type. In other words, the two reference values can be selectively used according to whether the threshold voltage of the driving transistor has one of positive and negative values.

A reference voltage for the red, green and blue sub-pixels can be set in accordance with one of the two reference values Ref1(RGB) and Ref2(RGB) and applied to an anode electrode of the OLED display element through the second sub reference voltage line SRVL2. Another reference voltage for the white sub-pixel can be set in accordance with one of the two reference values Ref1(W) and Ref2(W) and applied to an anode electrode of the OLED display element through the first sub reference voltage line SRVL1.

The current flowing through the OLED display element during the emitting interval can become approximately 'Ioled=β(Vdata−Vref)2/2'. In this case, the reference voltage Vref is determined from the distribution of the threshold voltages of the respective sub-pixels. As such, a current that compensates for a deviation of the threshold voltage can flow through the OLED display elements.

Figure 10:
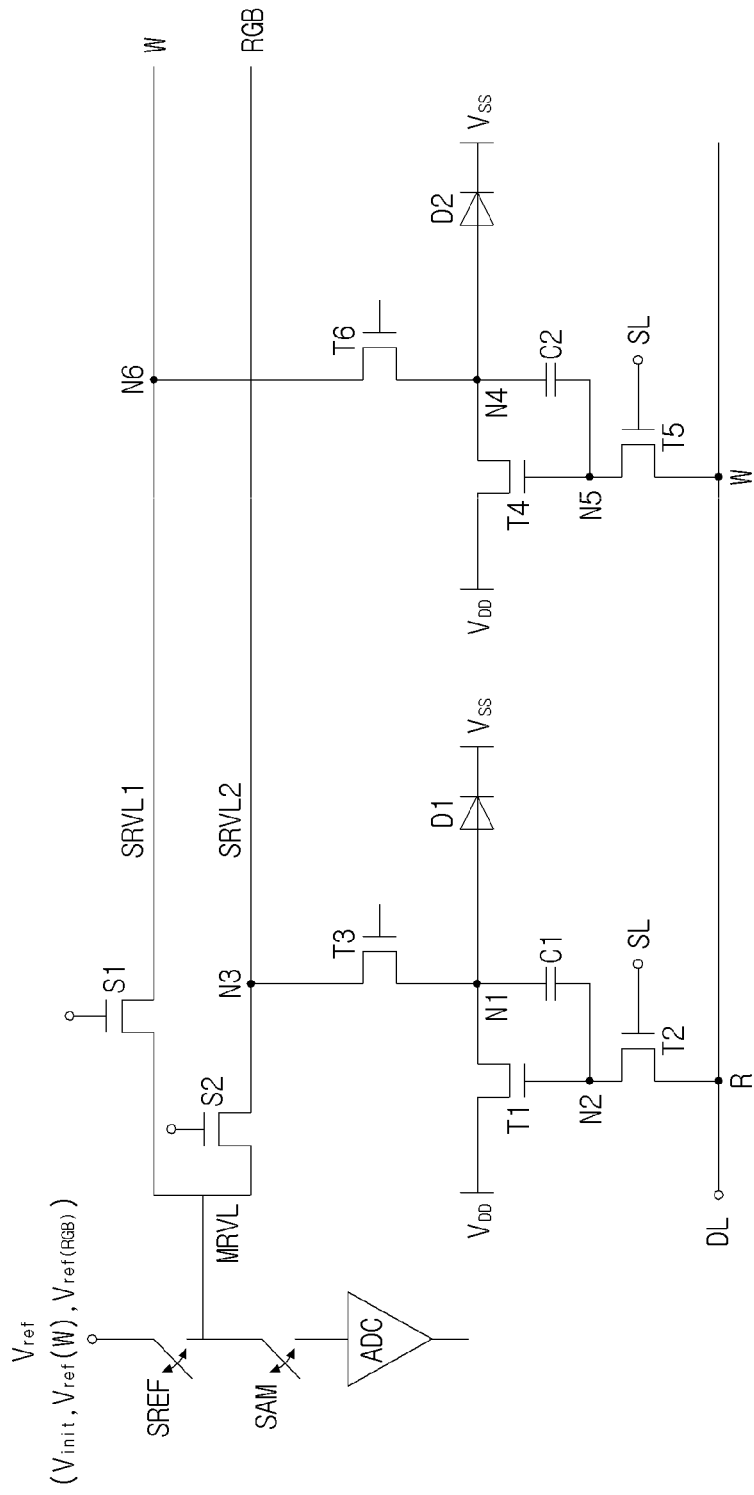
FIG. 10 is a circuit diagram showing a white sub-pixel and a red sub-pixel among red, green and blue sub-pixels according to an embodiment of the present disclosure.
Figure 11:
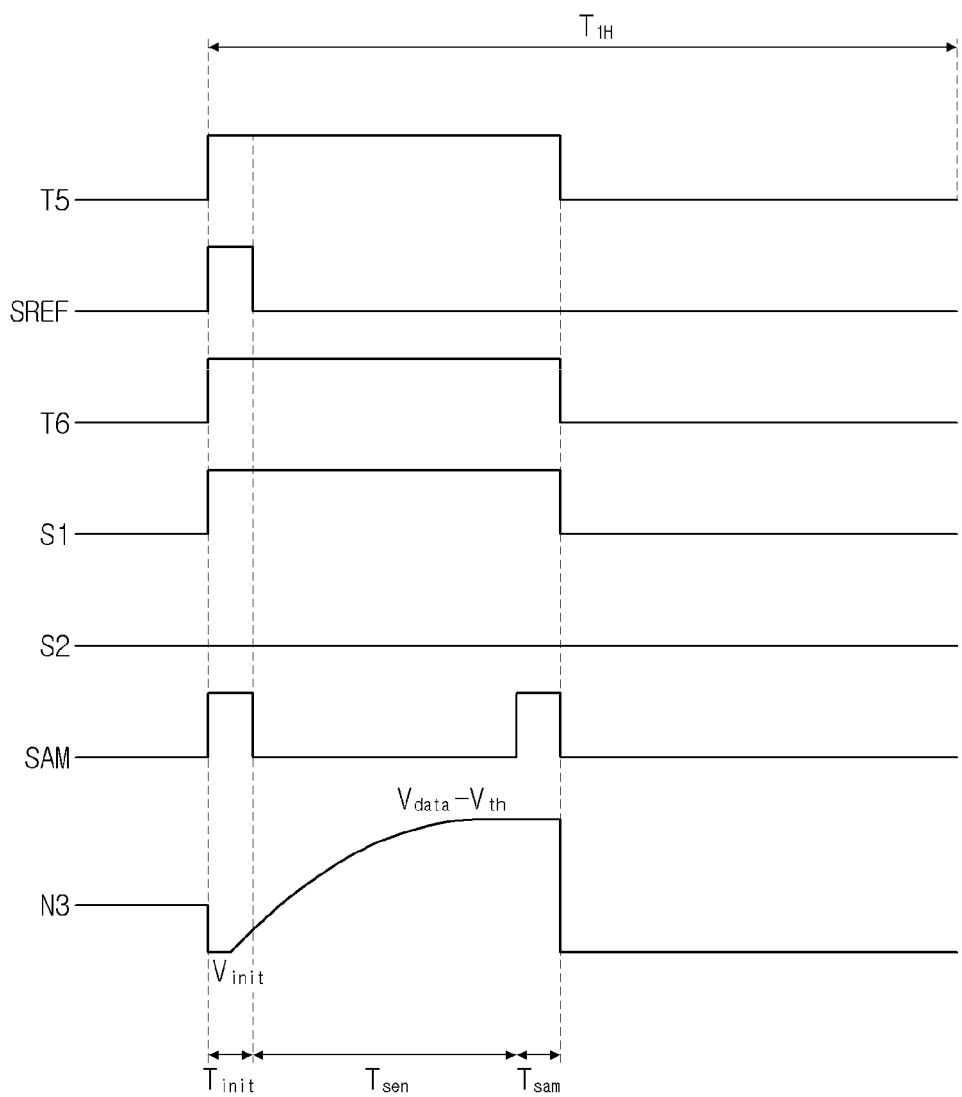
FIGS. 11 through 13 are waveform diagrams showing signals which are applied to the circuit of FIG. 10.
Figure 12:
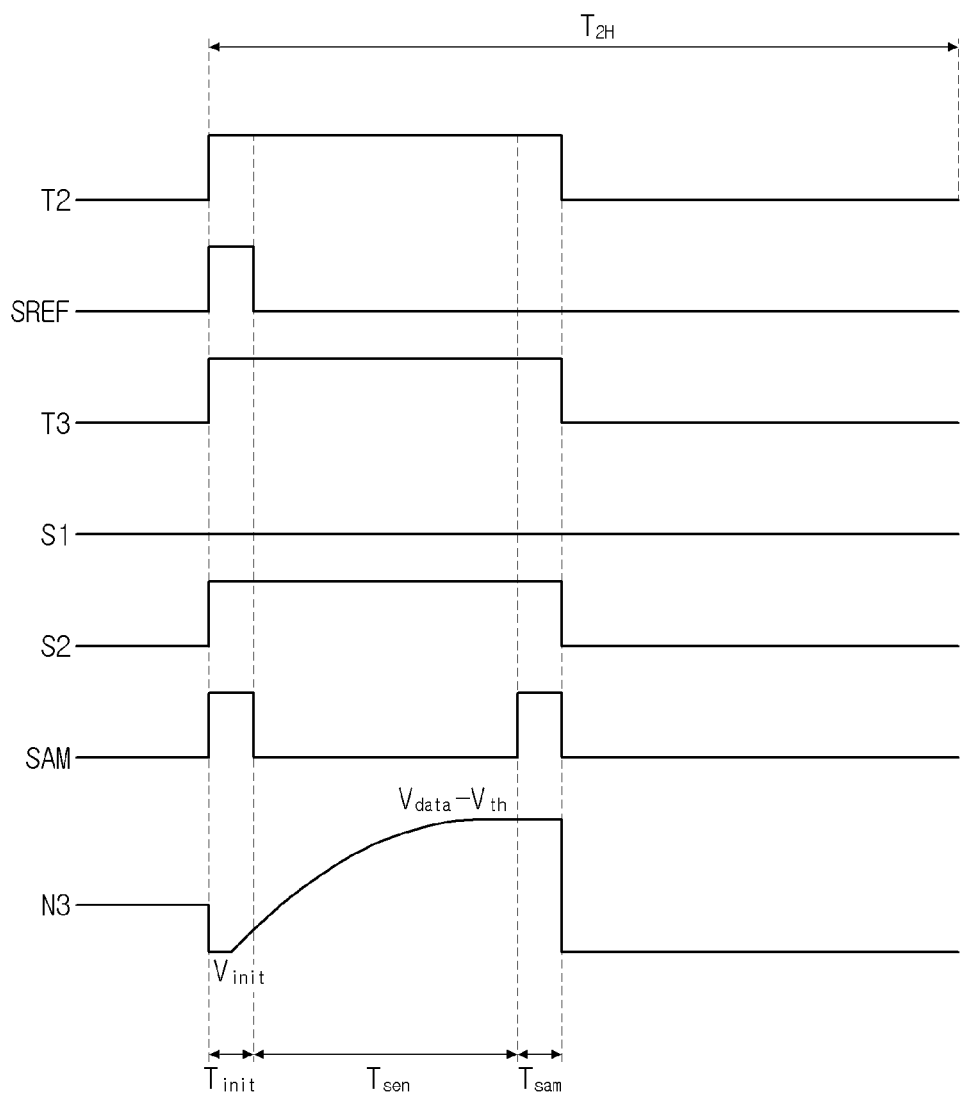
Figure 13:
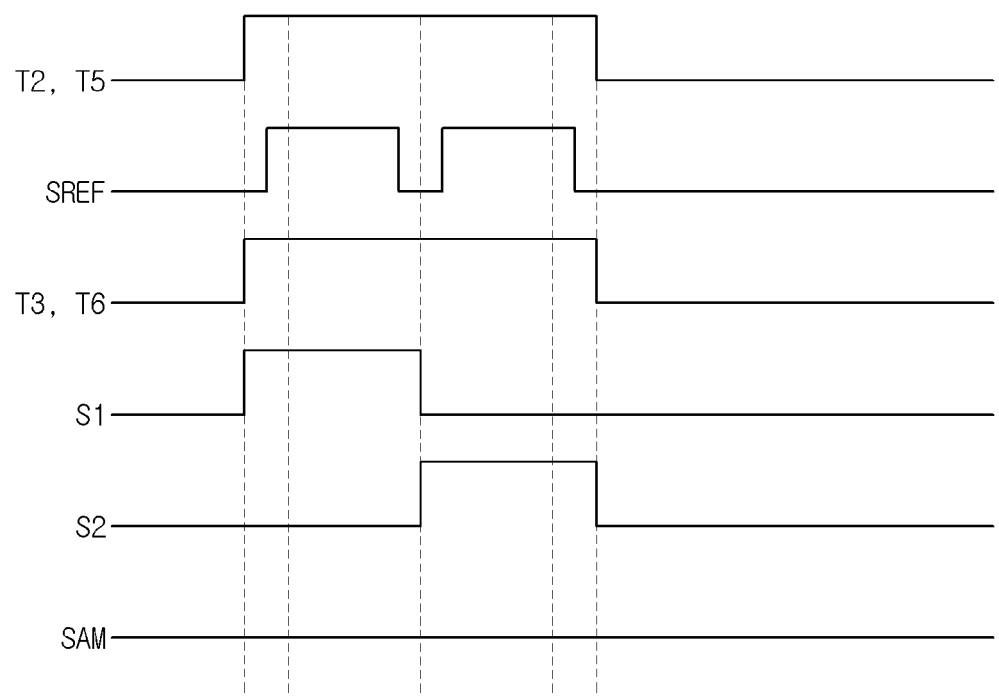

FIG. 10 is a circuit diagram showing a white sub-pixel and a red sub-pixel among red, green and blue sub-pixels according to an embodiment of the present disclosure. FIGS. 11 through 13 are waveform diagrams showing signals which are applied to the circuit of FIG. 10.

Referring to FIGS. 10 and 11, the operation of the white sub-pixel is now explained. A data voltage Vdata is applied to a fifth node N5 and an initial voltage Vinit is applied to a fourth node N4, during the initial interval of a first frame period T1H. To this end, a reference switch SREF, a sampling switch SAM, the second scan transistor T5, the second sensing transistor T6, the first switching element S1 are turned-on (or activated) during the initial interval Tinit of the first frame period T1H.

In the sensing interval Tsen of the first frame period T1H, the reference switch SREF and the sampling switch SAM are turned-off. As such, the fourth node N4 enters a floating stage and a voltage on the fourth node N4 rises. The voltage on the fourth node N4 can be detected during the sampling interval Tsam of the first frame period T2H when the sampling switch SAM is turned-on. In accordance therewith, a threshold voltage of the second driving transistor T2 can be determined from a difference between the detected voltage of 'Vdata−Vth' and the data voltage Vdata applied to the fifth node N5.

The detected voltage from the fourth node N4 can be converted into a digital data by means of an analog-to-digital converter ADC.

Referring to FIGS. 10 and 12, the operation of the red sub-pixel is now explained. The reference switch SREF, the sampling switch SAM, the first scan transistor T2, the first sensing transistor T3 and the second switching element S2 can be turned-on (or activated) during the initial interval Tinit of a second frame period T2H. As such, the data voltage Vdata is applied to the second node N2 and the initial voltage Vinit is applied to the first node N1, during the initial interval Tinit of the second frame period T2H.

In the sensing interval Tsen of the second frame period T2H, the reference switch SREF and the sampling switch SAM are turned-off. As such, the first node N1 enters a floating state and a voltage on the first node N1 rises. The voltage on the first node N1 can be detected during the sampling interval Tsam of the second frame period T2H when the sampling switch SAM is turned-on. In accordance therewith, a threshold voltage of the first driving transistor T1 can be obtained from the detected voltage of 'Vdata−Vth' and the data voltage Vdata applied to the second node N1.

The detected voltage from the first node N1 can be converted into digital data by means of the analog-to-digital converter ADC. In other words, the analog-to-digital converter ADC can convert the detected voltage into a digital value and store the converted digital value a memory (not shown) as a sensed threshold voltage. The analog-to-digital converter ADC and the memory can be included in the sensing unit 111 shown in FIG. 4.

The sensing unit 111 can determine the threshold voltages of the driving transistors of the sub-pixels. Also, the sensing unit 111 can apply the threshold voltages to the reference voltage setter 220.

The reference voltage setter 220 sorts the detected threshold voltages into the threshold voltages for the white sub-pixels and the threshold voltages for the red, green and blue sub-pixels, and analyzes the distributional map of the threshold voltages of FIG. 3. Also, the reference voltage setter 220 determines a reference value Ref1(RGB) or Ref2(RGB) for the driving transistors of the red, green and blue sub-pixels and another reference value Ref1(W) or Ref2(W) for the driving transistor of the white sub-pixel from the analyzed distributional map of the threshold voltages. Moreover, the reference voltage setter 220 applies the reference values Ref1 or Ref2 to the reference voltage supplier 330.

The reference voltage supplier 330 receives the reference values Ref1 or Ref2 and generate references voltages Vref each corresponding the reference values Ref1 or Ref2. Also, the reference voltage supplier 330 can apply the generated reference voltages Vref to the source electrode of the driving transistor of the white sub-pixel and the source electrodes of the driving transistors of the red, green and blue sub-pixels.

As such, a current flowing from the drain electrode of the driving transistor toward the source of the driving transistor can be determined according to a potential difference between a data voltage, which is applied to the gate electrode of the driving transistor, and the reference voltage Vref applied to the source electrode of the driving transistor. A light quantity emitted from the OLED display element can be adjusted by the current flowing through the driving transistor.

In order to easily generate the reference voltages Vref, the reference voltage supplier 330 can include a memory with a look-up table in which reference voltage values are listed next to their obtainable reference values Ref1 or Ref2.

Referring to FIGS. 10 and 13, the operation of the sub-pixels during the emitting interval is now explained. The first switching element S1 and the reference switch SREF can be turned-on during a part of the emitting interval. As such, a reference voltage corresponding to the reference value Ref1 (W) or Ref1(W) can be applied to the fourth node N4 of the white sub-pixel during a part of the emitting interval. On the other hand, the second switching element S2 and the reference switch SREF can be turned-on during the rest of the emitting interval. In accordance therewith, another reference voltage Vref corresponding to the reference value Ref1(RGB) or Ref2(RGB) can be applied to the nodes N1 of the red, green and blue sub-pixels.

In this manner, the threshold voltage of the driving transistor within each of the sub-pixels can be compensated for. Also, the sub-pixels can be sorted into a white sub-pixel group and a red, green and blue sub-pixel group and proper reference voltages can be applied to the respective driving transistors of the sorted sub-pixel groups. As such, color differences can be compensated for, and brightnesses of the red, green and blue sub-pixels and brightness of the white sub-pixel can be optimized.

Moreover, the single main reference voltage line MRVL and the two sub reference voltage lines SRVL1 and SRVL2 are used to optimize brightness of each sub-pixel. As such, it is not necessary to include an additional (or a separated) driver into the OLED display device. Therefore, increase in complexity and size of the driver can be prevented.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents without being limited to the description of the present disclosure.

What is claimed is:

1. An organic light emitting diode display device comprising:
   a plurality of first sub-pixels, the plurality of first sub-pixels having first light emitting elements emitting first color light and first driving transistors to drive current through the first light emitting elements;
   a first reference voltage line to provide a first reference voltage to source electrodes of the first driving transistors;
   a plurality of second sub-pixels, the plurality of second sub-pixels having second light emitting elements emitting second color light and second driving transistors to drive current through the second light emitting elements;
   a plurality of third sub-pixels, the plurality of third sub-pixels having third light emitting elements emitting third color light and third driving transistors to drive current through the third light emitting elements;
   a plurality of fourth sub-pixels, the plurality of fourth sub-pixels having fourth light emitting elements emitting fourth color light and fourth driving transistors to drive current through the fourth light emitting elements; and
   a second reference voltage line to provide a second reference voltage to source electrodes of the second driving transistors, to source electrodes of the third driving transistors, and source electrodes of the fourth driving transistors.

2. The organic light emitting diode display device of claim 1, wherein the first light emitting elements emit white light, the second light emitting elements emit red light, the third light emitting elements emit green light, and the fourth light emitting elements emit blue light.

3. The organic light emitting diode display device of claim 1, wherein the display device comprises:
   a sensing unit to:
      determine first threshold voltages of the first driving transistors
      determine second threshold voltages of the second driving transistors;
      determine third threshold voltages of the third driving transistors; and
      determine fourth threshold voltages of the fourth driving transistors; and
   a reference voltage unit to generate the first reference voltage based on the first threshold voltages and to generate the second reference voltage based on the second, third and fourth threshold voltages.

4. The organic light emitting diode display device of claim 1, wherein:
   the plurality of first sub-pixels have first sense transistors connecting the source electrodes of the first driving transistors to the first reference voltage line; and
   the plurality of second sub-pixels have second sense transistors connecting the source electrodes of the second driving transistors to the second reference voltage line.

5. An organic light emitting diode display device comprising:
   a plurality of first sub-pixels, the plurality of first sub-pixels having first light emitting elements emitting first color light and first driving transistors to drive current through the first light emitting elements;
   a first reference voltage line to provide a first reference voltage to source electrodes of the first driving transistors;
   a plurality of second sub-pixels, the plurality of second sub-pixels having second light emitting elements emitting second color light and second driving transistors to drive current through the second light emitting elements;
   a second reference voltage line to provide a second reference voltage to source electrodes of the second driving transistors;
   a sensing unit to determine first threshold voltages of the first driving transistors and to determine second threshold voltages of the second driving transistors; and
   a reference voltage unit to generate the first reference voltage based on the first threshold voltages and to generate the second reference voltage based on the second threshold voltages.

6. The organic light emitting diode display device of claim 5, wherein
   the sensing unit determines the first threshold voltages by, for each first driving transistor, sensing a source voltage at the source electrode of the first driving transistor and determining the first threshold voltage of the first driving transistor based on the source voltage, and
   the sensing unit determines the second threshold voltages by, for each second driving transistor, sensing a source voltage at the source electrode of the second driving transistor and determining the second threshold voltage of the second driving transistor based on the source voltage.

7. The organic light emitting diode display device of claim 6, wherein the source voltage at the source electrode of the first driving transistor is sensed through the first reference voltage line, and the source voltage at the source electrode of the second driving transistor is sensed through the second reference voltage line.

8. The organic light emitting diode display device of claim 6, wherein:
   the first threshold voltage of the first driving transistor is determined based on a difference between the source voltage at the source electrode of the first driving transistor and a data voltage at a gate electrode of the first driving transistor, and the second threshold voltage of the second driving transistor is determined based on a difference between the source voltage at the source electrode of the second driving transistor and a data voltage at a gate electrode of the second driving transistor.

9. The organic light emitting diode display device of claim 5, wherein the reference voltage unit generates the first reference voltage based on a threshold distribution corresponding to the first threshold voltages, and the reference voltage unit generates the second reference voltage based on a threshold distribution corresponding to the second reference voltages.

10. An organic light emitting diode display device comprising:
a plurality of first sub-pixels, the plurality of first sub-pixels having first light emitting elements emitting first color light and first driving transistors to drive current through the first light emitting elements;
a first reference voltage line to provide a first reference voltage to source electrodes of the first driving transistors;
a plurality of second sub-pixels, the plurality of second sub-pixels having second light emitting elements emitting second color light and second driving transistors to drive current through the second light emitting elements;
a second reference voltage line to provide a second reference voltage to source electrodes of the second driving transistors;
a main reference voltage line to carry the first reference voltage and the second reference voltage at different times; and
switching circuitry to selectively connect the main reference voltage line to the first reference voltage line and the second reference voltage line.

11. An organic light emitting diode display device comprising:
a plurality of first sub-pixels, the plurality of first sub-pixels having first light emitting elements emitting first color light and first driving transistors to drive current through the first light emitting elements;
a first reference voltage line to provide a first reference voltage to source electrodes of the first driving transistors, wherein for each first driving transistor, a difference between a data voltage at a gate electrode of the first driving transistor and the first reference voltage corresponds to a current flowing through the first driving transistor,
a plurality of second sub-pixels, the plurality of second sub-pixels having second light emitting elements emitting second color light and second driving transistors to drive current through the second light emitting elements; and
a second reference voltage line to provide a second reference voltage to source electrodes of the second driving transistors, wherein for each second driving transistor, a difference between a data voltage at a gate electrode of the second driving transistor and the second reference voltage corresponds to a current flowing through the second driving transistor.

12. A method of operation in an organic light emitting diode display device, the method comprising:
providing a first reference voltage to a plurality of first sub-pixels, the plurality of first sub-pixels having first light emitting elements emitting first color light and first driving transistors to drive current through the first light emitting elements, the first reference voltage provided to source electrodes of the first driving transistors; and
providing a second reference voltage to a plurality of second sub-pixels, a plurality of third sub-pixels, and a plurality of fourth sub-pixels,
the plurality of second sub-pixels having second light emitting elements emitting second color light and second driving transistors to drive current through the second light emitting elements,
the plurality of third sub-pixels having third light emitting elements emitting third color light and third driving transistors to drive current through the third light emitting elements,
the plurality of fourth sub-pixels having fourth light emitting elements emitting fourth color light and fourth driving transistors to drive current through the fourth light emitting elements, and
the second reference voltage provided to source electrodes of the second driving transistors, to source electrodes of the third driving transistors, and to source electrodes of the fourth driving transistors.

13. An organic light emitting diode display device comprising pluralities of red, green, blue and white sub-pixels which each include:
a driving transistor;
an organic light emitting diode display element configured to emit light by a current which is adjusted according to a potential difference between gate and source electrodes of the driving transistor; and
a sensing transistor configured to sense a voltage on the source electrode of the driving transistor and apply one of first and second reference voltages to the source electrode of the driving transistor,
wherein the first reference voltage depends on a threshold voltage of the driving transistor within each of the red, green and blue sub-pixels and is applied to the source electrode of the driving transistor included in each of the red, green and blue sub-pixels, and the second reference voltage depends on another threshold voltage of the driving transistor within the white sub-pixels and is applied to the source electrode of the driving transistor within the white sub-pixels.

14. The organic light emitting diode display device of claim 13, wherein
each of the sub-pixels further includes a scan transistor which is controlled by a scan signal on a scan line and transfers a data voltage on a data line to the gate electrode of the driving transistor,
the data voltage is applied to the gate electrode of the driving transistor and an initial voltage is applied to the source electrode of the driving transistor, in an initial interval,
a voltage on the source electrode of the driving transistor is varied during a sensing interval,
the threshold voltage is detected by sensing the voltage on the source electrode of the driving transistor during a sampling interval, and
one of the first and second reference voltages is applied to the source electrode of the driving transistor during an emitting interval.

15. The organic light emitting diode display device of claim 14, wherein
the sensing transistors of the red, green and blue sub-pixels are connected to a first sub reference voltage line, and the sensing transistor of the white sub-pixel is connected to a second sub reference voltage line.

16. The organic light emitting diode display device of claim 15, wherein for the red, green and blue sub-pixels, the sensing transistor applies the initial voltage on the first sub reference voltage line to the source electrode of the driving transistor in response to a respective sensing control signal; and for the white sub-pixels, the sensing transistor applies the initial voltage on the second sub reference voltage line to the source electrode of the driving transistor in response to a respective sensing control signal.

17. The organic light emitting diode display device of claim 16, wherein for the red, green and blue sub-pixels, the initial voltage is applied from the first sub reference voltage line to the source electrode of the driving transistor during the initial interval, and the source electrode of the driving transistor is floated during the sensing interval, and for the white sub-pixels, the initial voltage is applied from the second sub reference voltage line to the source electrode of the driving transistor during the initial interval, and the source electrode of the driving transistor is floated during the sensing interval.

18. The organic light emitting diode display device of claim 17, further comprising a sensing unit configured to sense the voltages on the source electrodes of the driving transistors and detect the threshold voltages of the driving transistors on the basis of the sensed voltages.

19. The organic light emitting diode display device of claim 18, further comprising a reference voltage unit configured to set the first and second reference voltages on the basis of the detected threshold voltages from the sensing unit, a distributional curve of the threshold voltage of the driving transistor within each of the red, green and blue sub-pixels, and another curve of the threshold voltage of the driving transistor within the white sub-pixels.

20. The organic light emitting diode display device of claim 19, further comprising:

a main reference voltage line formed to transfer the first and second reference voltages from the reference voltage unit to the first and second sub reference voltage lines; and a switching element configured to selectively connect the main reference voltage line with any one of the first and second sub reference voltage lines.

* * * * *